United States Patent
Shin

(10) Patent No.: US 8,611,150 B2
(45) Date of Patent: Dec. 17, 2013

(54) FLASH MEMORY DEVICE INCLUDING FLAG CELLS AND METHOD OF PROGRAMMING THE SAME

(75) Inventor: Seung-Hwan Shin, Ulsan (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 331 days.

(21) Appl. No.: 13/205,771

(22) Filed: Aug. 9, 2011

(65) Prior Publication Data

US 2012/0106247 A1    May 3, 2012

(30) Foreign Application Priority Data

Oct. 28, 2010 (KR) .................. 10-2010-0106218

(51) Int. Cl.
*G11C 11/34* (2006.01)
(52) U.S. Cl.
USPC .............. 365/185.03; 365/63; 365/189.05
(58) Field of Classification Search
USPC ................. 365/185.03, 63, 189.05
See application file for complete search history.

(56) References Cited

U.S. PATENT DOCUMENTS

| 6,046,939 A | 4/2000 | Noda et al. |
| 7,532,495 B2 * | 5/2009 | Youn et al. ................ 365/63 |
| 2009/0313423 A1 | 12/2009 | Byeon |

FOREIGN PATENT DOCUMENTS

| JP | 10-222995 | 8/1998 |
| KR | 10-0486132 B1 | 4/2005 |
| KR | 1020090131105 A | 12/2009 |
| KR | 1020100013962 A | 2/2010 |

* cited by examiner

*Primary Examiner* — Son Dinh
*Assistant Examiner* — Nam Nguyen
(74) *Attorney, Agent, or Firm* — Volentine & Whitt, PLLC

(57) ABSTRACT

Provided is a flash memory device and a method of programming the same. The flash memory device includes a memory cell array, a first judgment circuit and a second judgment circuit. The memory cell array includes multiple main cells and multiple flag cells. The first judgment circuit judges program pass of the main cells, and the second judgment circuit judges program pass of the flag cells by applying a more strict judgment reference than the first judgment circuit.

19 Claims, 12 Drawing Sheets

FLASH MEMORY DEVICE INCLUDING FLAG CELLS AND METHOD OF PROGRAMMING THE SAME

CROSS-REFERENCE TO RELATED APPLICATIONS

A claim of priority under 35 U.S.C. §119 is made to Korean Patent Application No. 10-2010-0106218, filed on Oct. 28, 2010, the entire contents of which are hereby incorporated by reference.

BACKGROUND

The present disclosure herein to a semiconductor memory device and operating method thereof, and more particularly, to a flash memory device and a method program the same.

Semiconductor memory devices are memory devices implemented using semiconductor materials, such as silicon (Si), germanium (Ge), gallium arsenide (GaAs) and indium phosphide (InP). Semiconductor memory devices are largely divided into volatile memory devices and nonvolatile memory devices.

In volatile memory devices, stored data are erased when power source is shut off. Examples of volatile memory devices include Static Random Access Memory (SRAM), Dynamic Random Access Memory (DRAM) and Synchronous Dynamic Random Access Memory (SDRAM). In nonvolatile memory devices, stored data is retained even when power is shut off. Examples of nonvolatile memory devices include Read-Only Memory (ROM), Programmable Read Only Memory (PROM), Erasable Programmable Read Only Memory (EPROM), Electrical Erasable Programmable Read Only Memory (EEPROM), flash memory, Phase-change Random Access Memory (PRAM), Magnetoresistive Random Access Memory (MRAM), Resistive Random Access Memory (RRAM) and Ferroelectric Random Access Memory (FRAM). Flash memory devices are typically categorized into a NOR type and a NAND type flash memories.

Memory cells of a flash memory device have a data state that is determined according to the number of bits stored therein. A memory cell that stores 1-bit data is called a single bit cell or a Single Level Cell (SLC). A memory cell that stores multi-bit data (for example, data having two or more bits) is called a multi-bit cell or a Multi-Level Cell (MLC). With increasing demand for high integration of memory devices, research is being conducted on flash memory devices including multi-level cells.

SUMMARY

The present disclosure provides a flash memory device and a program operating method thereof, which increase a program operating speed and enhance reliability.

Embodiments of the inventive concept provide a flash memory device including a memory cell array, a first judgment circuit and a second judgment circuit. The memory cell array includes multiple main cells and multiple flag cells. The first judgment circuit judges program pass of the main cells, and the second judgment circuit judges program pass of the flag cells by applying a more strict judgment reference than the first judgment circuit.

In some embodiments, in a programming operation of the flag cells, the flag cells may be judged as being program-failed when at least one flag cell of the multiple flag cells is detected as having a threshold voltage lower than a verification read voltage.

In some embodiments, in a programming operation for the main cells, the first judgment circuit may count the number of failed bits of the main cells, and judge program pass of the main cells according to whether the counted number of failed bits is within a first permissible range. Also, in a programming operation for the flag cells, the second judgment circuit may count the number of failed bits of the flag cells, and judge program pass of the flag cells according to whether the counted number of failed bits is within a second permissible range, which is more limited than the first permissible range of the first judgment circuit.

In some embodiments, the number of main cells and the number of flag cells may be counted per program loop. Also, the main cells and the flag cells may be programmed by page unit, and the flag cells may be programmed while the main cells of a page corresponding to the flag cells are being programmed. Each of the main cells and the flag cells may include a multi-level cell storing 3-bit data.

In some embodiments, the flag cells may be programmed to have one of at least two states for indicating whether the main cells are Most Significant Bit (MSB)-programmed.

In some embodiments, flash memory device may further include a control logic circuit. The control logic circuit may control a programming operation of the main cells in response to the judgment result of the first judgment circuit, and may control a programming operation of the flag cells in response to the judgment result of the second judgment circuit.

Other embodiments of the inventive concept provide a flash memory device including a memory cell array, first and second judgment circuits, and a control logic circuit. The memory cell array includes main cells, first flag cells corresponding to 2-bit main cells of the main cells, and second flag cells corresponding to 3-bit main cells of the main cells. The first judgment circuit judges program pass of the main cells, and outputs a main judgment signal indicating the judgment result. The second judgment circuit judges program pass of the first and second flag cells by applying a more strict judgment reference than the first judgment circuit, and outputs a flag judgment signal indicating the judgment result. The control logic circuit controls a programming operation of the main cells in response to the main judgment signal, and controls a programming operation of the first and second flag cells in response to the second judgment signal.

In some embodiments, in the programming operation for the main cells, even when at least one main cell has a threshold voltage lower than a verification read voltage, the first judgment circuit may judge the main cells as being program-passed when the number of main cells having a threshold voltage lower than the verification read voltage is within a permissible range. Also, in the programming operation for the first and second flag cells, the second judgment circuit may judge the first and second flag cells as being program-passed when each of the first and second flag cells have a threshold voltage equal to or higher than a verification read voltage.

In some embodiments, the first flag cells may be programmed to have one of at least two states for indicating whether the 2-bit main cells are Most Significant Bit (MSB)-programmed. The second flag cells may be programmed to have one of at least two states for indicating whether the 3-bit main cells are MSB-programmed.

In some embodiments, a verification read voltage applied in the programming operation of the first flag cells may differ from a verification read voltage applied in the programming operation of the second flag cells.

Yet other embodiments of the inventive concept provide a method of programming a flash memory device including a memory cell array having multiple main cells and multiple flag cells corresponding to the multiple main cells. The method includes programming the main cells and the flag cells; counting the number of failed bits of the main cells; counting the number of failed bits of the flag cells; judging the main cells to be program-failed when the counted number of failed bits of the main cells is greater than a predetermined first permissible value; and judging the flag cells to be program-failed when the counted number of failed bits of the flag cells is greater than a predetermined second permissible value. The predetermined second permissible value is more limited than the predetermined first permissible value.

In some embodiments, the predetermined first permissible value may be one, and the predetermined second permissible value may be zero.

In some embodiments, the method may further include repeating a program loop for the flag cells when the flag cells are judged to be program-failed. Also, the predetermined first permissible value may correspond to the number of error bits which are corrected by an Error Correction Code (ECC) algorithm.

BRIEF DESCRIPTION OF THE DRAWINGS

Illustrative embodiments of the inventive concept will be more clearly understood from the following detailed description taken in conjunction with the accompanying drawings, in which.

DETAILED DESCRIPTION OF THE EMBODIMENTS

Figure 1:
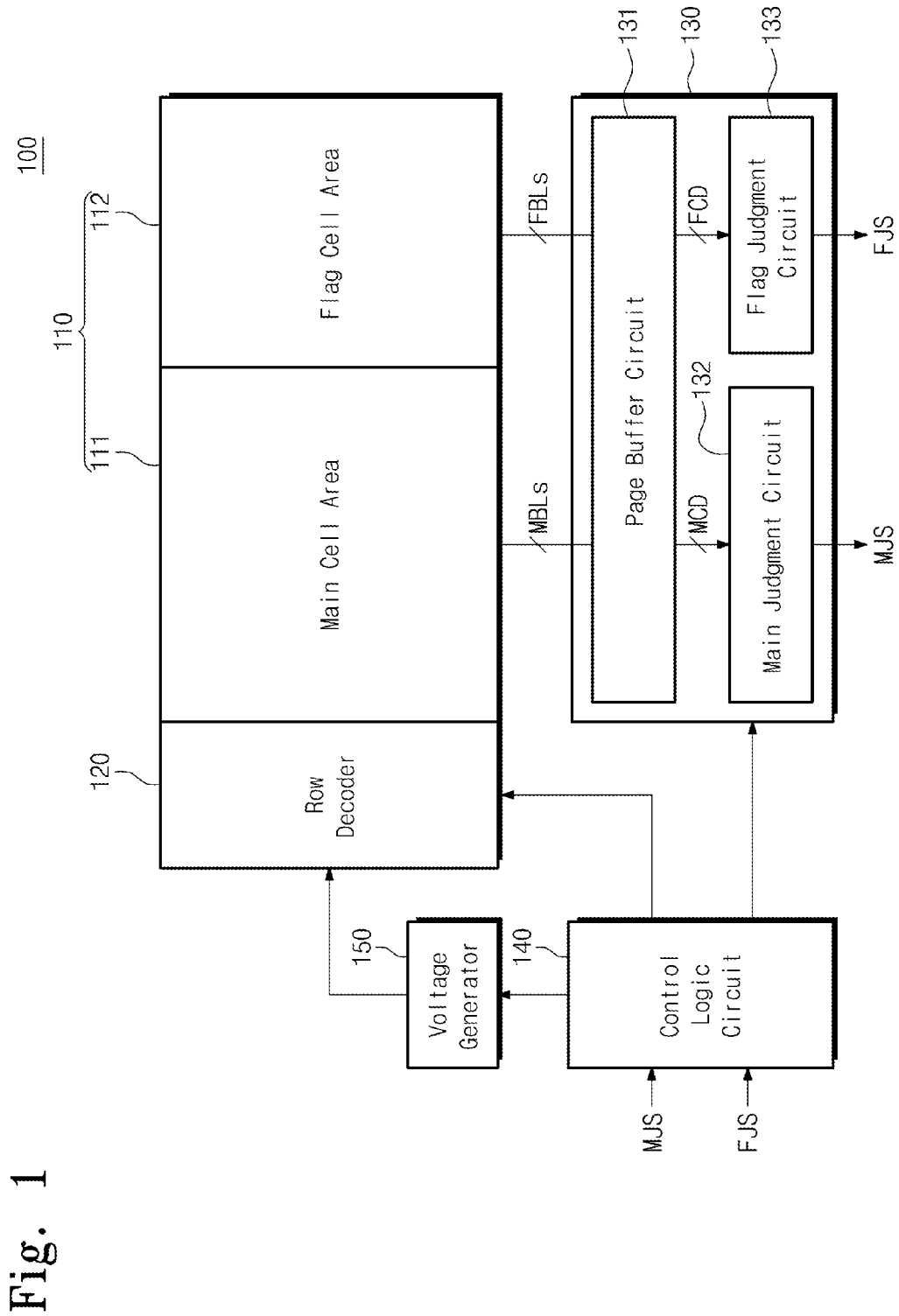
FIG. 1 is a block diagram showing a flash memory device, according to a first embodiment of the inventive concept.

Embodiments of the inventive concept will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

For conciseness, embodiments of the inventive concept will be described below with reference to a flash memory device. However, alternative embodiments of the inventive concept are not limited to the flash memory device. For example, the scope of the present teachings may be applied to nonvolatile memory devices such as ROM, PROM, EPROM, EEPROM, MRAM, PRAM, RRAM and FRAM.

FIG. 1 is a block diagram schematically illustrating a flash memory device, according to a first embodiment of the inventive concept.

Referring to FIG. 1, flash memory device 100 includes a memory cell array 110, a row decoder 120, a read/write circuit 130, a control logic circuit 140, and a voltage generator 150.

The memory cell array 110 includes memory cells that are arranged in a matrix type. Each of the memory cells may store single bit data or multi-bit data. That is, each of the memory cells may be a Single Level Cell (SLC), a Multi-Level Cell (MLC), or a combined type of SLC and MLC.

The memory cell array 110 includes a main cell area 111 for storing main data MCD, and a flag cell area 112 for storing flag data FCD. The flag data FCD indicates program states of memory cells (hereinafter referred to as "main cells") included in the main cell area 111 by page unit. For example, the flag data FCD indicates whether memory cells of a corresponding page have been most significant bit (MSB)-programmed. The flag data FCD are stored in memory cells (hereinafter referred to as "flag cells") included in the flag cell area 112. The memory cell array 110 is described below in more detail with reference to FIG. 2.

The row decoder 120 operates under control of the control logic circuit 140. The row decoder 120 may include various elements, such as an address buffer. The row decoder 120 decodes a row address provided from outside. The row decoder 120 drives word lines connected to the memory cell array 110 according to the decoded row address. The row decoder 120 applies word line voltages, such as selection read voltage, non-selection read voltage, program voltage and verification read voltage, which are supplied by the voltage generator 150, to a corresponding word line.

The read/write circuit 130 is connected to the memory cell array 110 through bit lines MBLs and FBLs, and operates under control of the control logic circuit 150. The read/write circuit 130 selects the bit lines MBLs and FBLs according to a decoded column address that is transferred from a column decoder (not shown). The read/write circuit 130 reads data from the memory cell array 110 in a reading operation and a verifying operation, and writes data in the memory cell array 110 in a programming operation. That is, the read/write circuit 130 operates as sense amplifier or a write amplifier according to the operation mode.

Although not shown, the flash memory device 100 may further include a data input/output circuit. The data input/output circuit transmits data read by the read/write circuit 130 to the outside. Also, the data input/output circuit receives data from the outside that is to be written by the read/write circuit 130.

The read/write circuit 130 includes a page buffer circuit 131, a main judgment circuit 132 and a flag judgment circuit 133. Although not shown, the read/write circuit 130 may further include various additional elements, such as a column selection circuit (not shown).

The page buffer circuit 131 stores main data MCD read from the main cell area 111 through the main bit lines MBLs, and flag data FCD read from the flag cell area 112 through the flag bit lines FBLs. Also, the page buffer circuit 131 stores main data MCD that is to be written in the main cell area 111 through the main bit lines MBLs, and flag data FCD that is to be written in the flag cell area 112 through the flag bit lines FBLs.

The main judgment circuit 132 judges whether program pass is achieved for the main cells on the basis of the main data MCD read in the verifying operation. In an embodiment, the main judgment circuit 132 counts the number of main cells that have a threshold voltage lower than a verification read voltage per program loop. That is, the main judgment circuit 132 counts the number of failed bits of main cells per program loop, and compares the number of failed bits to a judgment reference, which may be a first permissible range.

The main judgment circuit 132 determines that programming is complete when the number of failed bits of the main cells is within the first permissible range. For example, the first permissible range may be defined by a predetermined first permissible value corresponding to the maximum number of failed bits allowed for the main cells. The main judgment circuit 132 determines that programming is not complete when the number of failed bits of the main cells is outside the first permissible range (e.g., exceeds the predetermined first permissible value). The main judgment circuit 132 may provide a main judgment signal MJS to the control logic circuit 140, where the main judgment signal MJS indicates the judgment result of program pass for the main cells.

The failed bits may be corrected with an Error Correction Code (ECC) algorithm in the reading operation. The number of correctable failed bits depends on the processing ability of the ECC algorithm. As a result, the processing ability of the ECC algorithm may determine the permissible range of the number of failed bits.

According to an embodiment of the inventive concept, failed bits of main cells may be corrected by the ECC algorithm in the reading operation. Accordingly, the programming operation is complete when the number of failed bits of main cells is within the first permissible range, and thus program time and program disturbance may be reduced.

The flag judgment circuit 133 judges whether program pass is achieved for flag cells on the basis of flag data FCD read in the verifying operation. In an embodiment, the flag judgment circuit 133 counts the number of flag cells that have a threshold voltage lower than the verification read voltage per program loop. That is, the flag judgment circuit 133 counts the number of failed bits of flag cells per program loop, and compares the number of failed bits to another judgment reference, which may be a second permissible range, which is more strict or limited than the judgment reference of the main judgment circuit 132.

The flag judgment circuit 133 determines that programming is complete when the number of failed bits of the flag cells is within the second permissible range. For example, the second permissible range may be defined by a predetermined second permissible value corresponding to the maximum number of failed bits allowed for the flag cells. The flag judgment circuit 133 determines that programming is not complete when the number of failed bits of flag cells is outside the second permissible range (e.g., exceeds the predetermined second permissible value). As mentioned above, the second permissible range applied by the flag judgment circuit 133 may be more strict or more limited for determining the number of failed bits of the flag cells than the first permissible range applied by the main judgment circuit 132 for determining the number of failed bits of the main cells, in order to judge whether program pass is achieved. For example, the predetermined second permissible value may be less than the predetermined first permissible value. The flag judgment circuit 133 may judge that programming is not complete, for example, when at least one failed bit is counted for the flag cells. Furthermore, the flag judgment circuit 133 may provide a flag judgment signal FJS to the control logic circuit 140, where the flag judgment signal FJS indicates the judgment result of program pass for the flag cells.

Least Significant Bit (LSB) programming operations of MLCs and MSB programming operations of MLCs are performed according to a program algorithm that is selected according to the analyzed result of flag data FCD. Furthermore, LSB reading operations of MLCs and MSB reading operations of MLCs are performed according to a read algorithm that is selected according to the analyzed result of flag data FCD. In other words, the flag data FCD is used as reference information during programming and reading operations for the main cells. Therefore, flag data FCD must be accurately programmed to enable normal programming and reading operations for the main cells.

According to the first embodiment of the inventive concept, the flash memory device 100 applies a more strict or more limited permissible range for the number of failed bits of the flag cells (second permissible range) than the permissible range for the number of failed bits of the main cells (first permissible range), and judges whether program pass is achieved, thereby enhancing reliability of the programming and reading operations.

The control logic circuit 140 controls overall operations of the flash memory device 100, such as the programming, erasing and reading operations. For example, the control logic circuit 140 controls the row decoder 120, the read/write circuit 130 and the voltage generator 150 in order for a program voltage and a pass voltage to be respectively applied to a selected word line and unselected word lines during the programming operation. In an embodiment, the program voltage may be generated according to an Incremental Step Pulse Programming (ISPP) scheme. That is, the program voltage may incrementally increase according to repetition of program loops.

The control logic circuit 140 controls a programming operation for the main cells in response to the main judgment signal MJS. For example, the control logic circuit 140 may perform continuously or end a programming operation for main cells of a page unit according to the main judgment signal MJS.

The control logic circuit 140 controls a programming operation for the flag cells in response to the flag judgment signal FJS. For example, the control logic circuit 140 may perform continuously or end a programming operation for flag cells of a page unit according to the flag judgment signal FJS.

The voltage generator 150 generates word line voltages according to an operation mode under control of the control logic circuit 150. The voltage generator 150 supplies the word line voltages to the row decoder 120.

Figure 2:
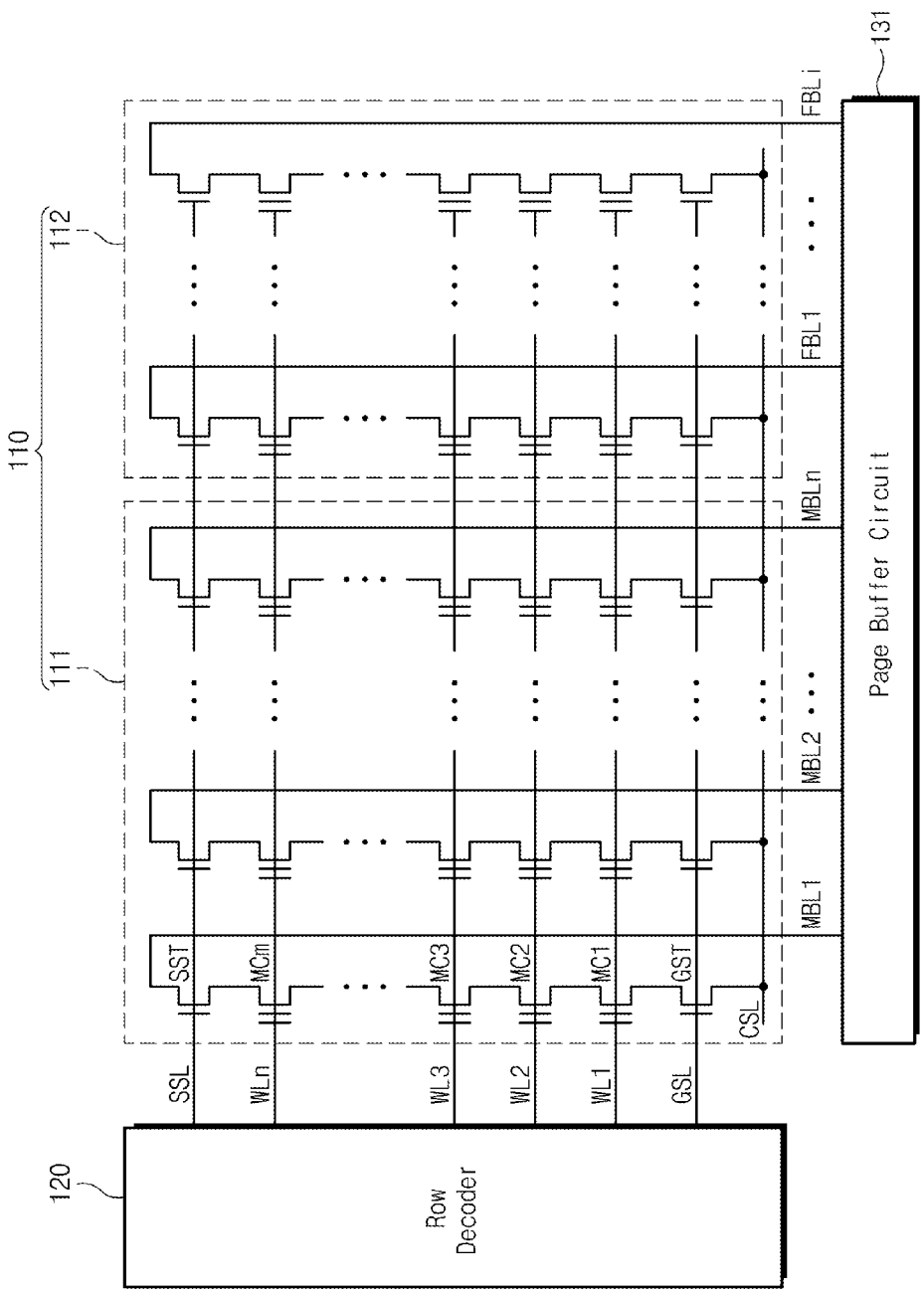
FIG. 2 is a circuit diagram showing an illustrative structure of a memory cell array in FIG. 1, according to an embodiment of the inventive concept.

FIG. 2 is a circuit diagram showing an illustrative structure of the memory cell array 110 in FIG. 1, according to an embodiment of the inventive concept.

Referring to FIG. 2, as described above, the memory cell array 110 includes the main cell area 111 and the flag cell area 112. The memory cell array 110 of FIG. 2 corresponds to one memory block. However, the memory cell array 110 may include multiple memory blocks.

The memory cell array 110 (i.e., the main cell area 111 and the flag cell area 112) includes multiple strings. The strings are connected to corresponding bit lines MBL1 to MBLn and FBL1 to FBLi, respectively. For example, the strings of the main cell area 111 are connected to corresponding main bit lines MBL1 to MBLn, respectively, and the strings of the flag cell area 112 are connected to corresponding flag bit lines FBL1 to FBLi, respectively.

Each of the strings includes a string selection transistor SST, a ground selection transistor GST, and memory cells MC1 to MCn. The memory cells MC1 to MCn are connected between the string selection transistor SST and the ground selection transistor GST. A drain/source of the string selection transistor SST is connected to a corresponding bit line. A source/drain of the ground selection transistor GST is connected to a common source line CSL. The string selection transistor SST is controlled by a string selection voltage applied through a string selection line SSL, and the ground selection transistor GST is controlled by a ground selection voltage applied through a ground selection line GSL. Control gates of the memory cells MC1 to MCn are connected to corresponding word lines WL1 to WLn, respectively.

Flag cells are programmed in order to determine whether the main cells of a corresponding page are MSB-programmed. For example, the flag cells may be programmed while the main cells of the corresponding page are being MSB-programmed. Whether the main cells of the page corresponding to the flag cells are MSB-programmed may be determined by analyzing flag data stored in the flag cells.

In the first embodiment, each of the main cells and the flag cells may be an MLC that stores 2-bit data or 3-bit data. However, the main cells and the flag cells are not limited by the number of data bits, and may be an MLC that stores data of 4-bit data or more, or by an SLC or a combined type of SLC and MLC.

Figure 3:
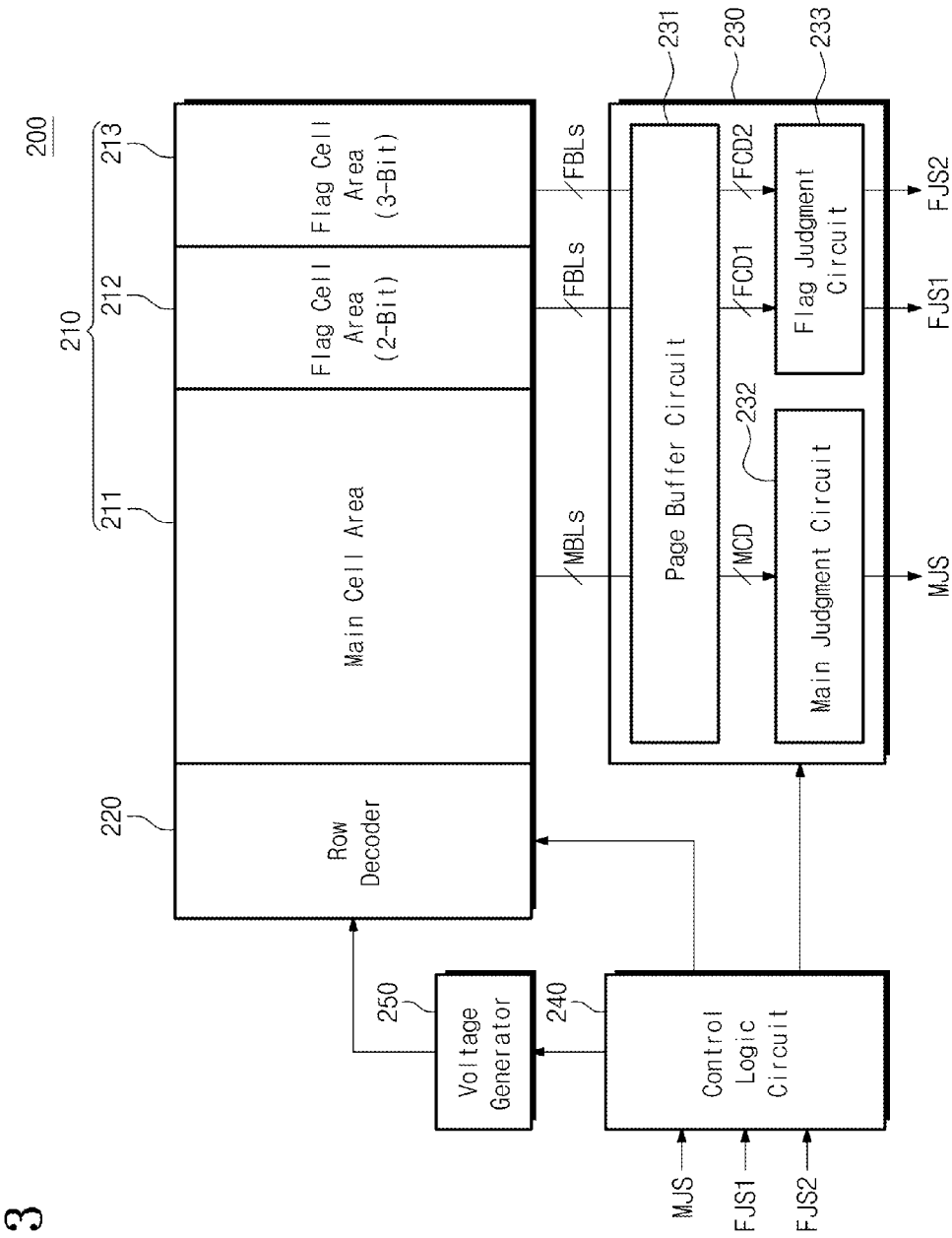
FIG. 3 is a block diagram showing a flash memory device, according to a second embodiment of the inventive concept.
Figure 4:
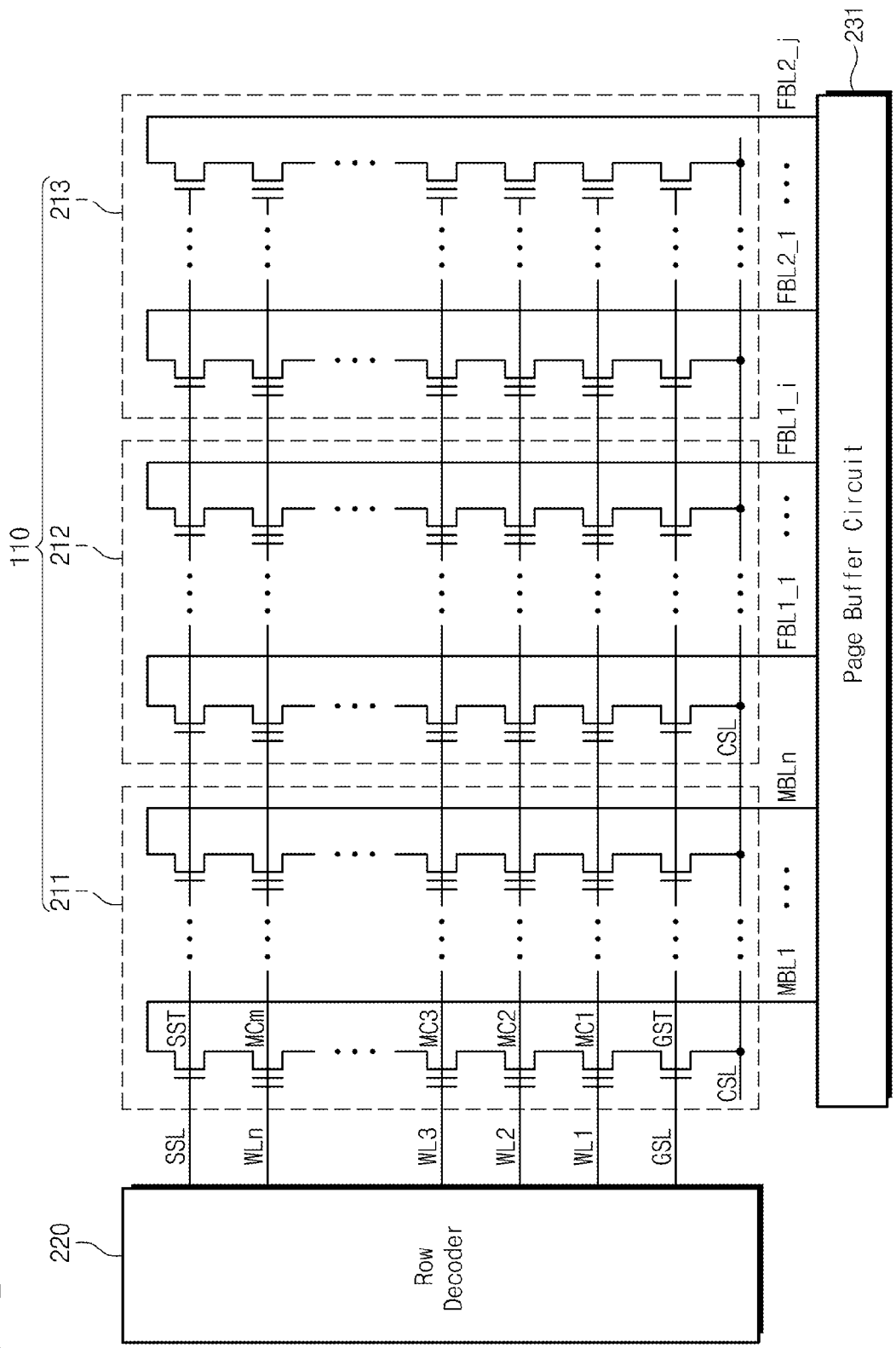
FIG. 4 is a circuit diagram showing an illustrative structure of a memory cell array in FIG. 3, according to an embodiment of the inventive concept.

FIG. 3 is a block diagram illustrating a flash memory device 200 according to a second embodiment of the inventive concept. FIG. 4 is a circuit diagram showing an illustrative structure of a memory cell array 210 in FIG. 3. The following description focuses on differences between the flash memory device 200 according to the second embodiment of the inventive concept and the flash memory device 100 according to the first embodiment of the inventive concept. Therefore, repetitive descriptions of various elements of the flash memory device 200, such as row decoder 220, read/write circuit 230, control logic circuit 240, and voltage generator 250, will not be provided.

Referring to FIG. 3, the memory cell array 210 includes a main cell area 211, a first flag cell area 212, and a second flag cell area 213. In the second embodiment of the inventive concept, flag cells of the first flag area 212 store first flag data FCD1 indicating whether main cells storing 2-bit data (hereinafter referred to as "2-bit main cells") have been MSB-programmed. Flag cells of the second flag area 213 store second flag data FCD2 indicating whether main cells storing 3-bit data (hereinafter referred to as "3-bit main cells") have been MSB-programmed.

The flag judgment circuit 233 determines whether program pass is achieved for flag cells on the basis of the first and second flag data FCD1 and FCD2 read in a verifying operation. For this, the flag judgment circuit 233 counts the number of flag cells that have a threshold voltage lower than a verification read voltage per program loop. That is, the flag judgment circuit 233 counts the number of failed bits of the flag cells per program loop.

As described above with reference to FIG. 1, the flag judgment circuit 233 may apply a more strict permissible range for the number of failed bits of the flag cells (second permissible range) than a permissible range for the number of failed bits of the main cells (first permissible range), and judge whether program pass is achieved. For example, the flag judgment circuit 233 may judge that programming is not complete when at least one failed bit is counted among the flag cells.

The flag judgment circuit 233 provides a first flag judgment signal FJS1, which indicates the judgment result of program pass for first flag cells, and a second flag judgment signal FJS2, which indicates the judgment result of program pass for second flag cells, to the control logic circuit 140.

Referring to FIG. 4, the memory cell array 210 (i.e., the main cell area 211 and the first and second flag cell areas 212 and 213) includes multiple strings.

The strings are connected to corresponding bit lines MBL1 to MBLn, FBL1_1 to FBL1_i and FBL2_1 to FBL2_i, respectively. For example, the strings of the main cell area 111 are connected to corresponding main bit lines MBL1 to MBLn, respectively. The strings of the first flag cell area 212 are connected to corresponding flag bit lines FBL1_1 to FBL1_i, respectively. The strings of the second flag cell area 213 are connected to corresponding flag bit lines FBL2_1 to FBL2_i, respectively.

The flag cells of the first flag area 212 are programmed in order to determine whether 2-bit main cells of a corresponding page are MSB-programmed. For this, the flag cells of the first flag area 212 may be programmed while the 2-bit main cells of the corresponding page are being MSB-programmed. Whether the 2-bit main cells of the page corresponding to the flag cells of the first flag area 212 are MSB-programmed may be determined by analyzing the first flag data FCD1.

The flag cells of the second flag area 213 are programmed in order to determine whether 3-bit main cells of a corresponding page are MSB-programmed. For this, the flag cells of the second flag area 213 may be programmed while the 3-bit main cells of the corresponding page are being MSB-programmed. Whether the 3-bit main cells of the page corresponding to the flag cells of the second flag area 213 are MSB-programmed may be determined by analyzing the second flag data FCD2.

In the second embodiment of the inventive concept, as described above, the memory cell array 210 may include the first and second flag areas 212 and 213. For example, the memory cell array 210 may be divided into the first flag area 212 for storing the first flag data and the second flag area 213 for storing the second flag data. The number of bits of data (corresponding to the first flag data) stored in main cells may be different from the number of bits of data (corresponding to the second flag data) stored in main cells.

Figure 5:
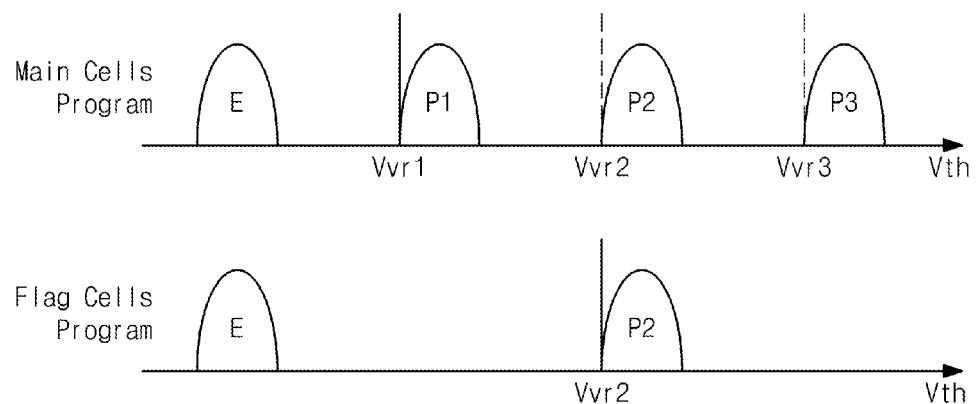
FIGS. 5 and 6 are diagrams showing illustrative threshold voltage distributions of MLCs.
Figure 6:
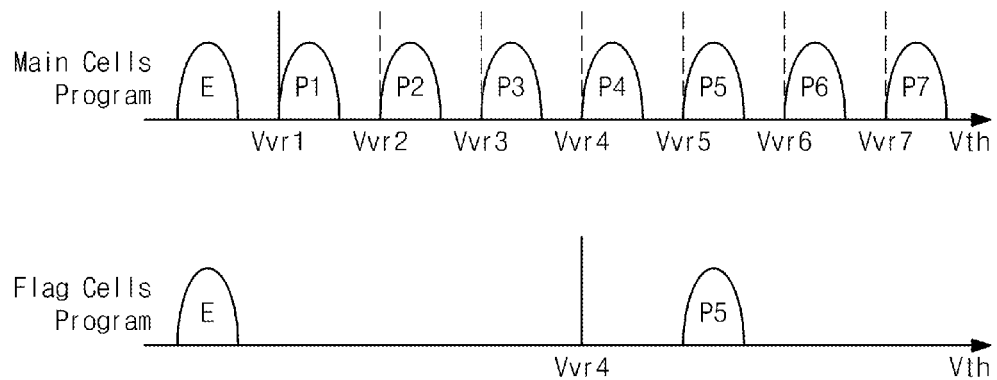

FIGS. 5 and 6 are diagrams showing illustrative threshold voltage distributions of MLCs. More particularly, FIG. 5 shows an illustrative threshold voltage distribution of main cells and flag cells configured with 2-bit MLCs, and FIG. 6 shows an illustrative threshold voltage distribution of main cells and flag cells configured with 3-bit MLCs.

Referring to FIG. 5, each of the main cells may have one of an erasure state E and first to third program states P1 to P3 according to the threshold voltage. As shown in FIG. 5, the threshold voltage of a main cell having the first program state P1 is higher than the threshold voltage of a main cell having erasure state E. The threshold voltage of a main cell having the second program state P2 is higher than the threshold voltage of the main cell having the first program state P1. The threshold voltage of a main cell having the third program state P3 is higher than the threshold voltage of the main cell having the second program state P2.

Each of the flag cells may have one of the erasure state E and the second program state P2 according to the threshold voltage. The erasure state E of each of the flag cells indicates that corresponding main cells are not MSB-programmed, and the second program state P2 of each of the flag cells indicates that corresponding main cells have been MSB-programmed.

First to third verification read voltages Vvr1 to Vvr3 may be used for verifying states of the main cells in a verifying operation. For example, one of the first to third verification read voltages Vvr1 to Vvr3 may be selected and applied to a selected word line per program loop, according to a program and read algorithm. Furthermore, the second verification read voltages Vvr2 may be used for verifying states of the flag cells in the verifying operation.

To judge whether program pass is achieved for the main cells, the number of main cells having a threshold voltage lower than a verification read voltage selected from among the first to third verification read voltages Vvr1 to Vvr3 (i.e., the number of failed bits of the main cells) is counted per program loop. When the number of failed bits of the main cells is within a first permissible range, a programming operation of page unit is complete. On the other hand, when the number of failed bits of the main cells is outside the first permissible range, program loops are repeated until the number of failed bits of the main cells is within the first permissible range. The first permissible range may have a corresponding predetermined first permissible value.

To judge whether program pass is achieved for the flag cells, the number of flag cells having a threshold voltage lower than the second verification read voltage Vvr2 (i.e., the number of failed bits of the flag cells) is counted per program loop. When the number of failed bits of the flag cells is within a second permissible range, a programming operation of page unit is complete. On the other hand, when the number of failed bits of the flag cells is outside the second permissible range, program loops are repeated until the number of failed bits of the flag cells is within the second permissible range. The second permissible range may have a corresponding predetermined second permissible value.

In the second embodiment of the inventive concept, program pass is judged by applying a more strict second permissible range for determining the number of failed bits of the flag cells than the first permissible range for determining the number of failed bits of the main cells. For example, when all flag cells corresponding to the same page have a threshold voltage higher than a verification read voltage (i.e., no failed bits), the programming of the page unit for the flag cells may be judged as being complete.

Referring to FIG. 6, each of the main cells may have one of an erasure state E and first to seventh program states P1 to P7 according to the threshold voltage. Each of the flag cells may have one of the erasure state E and the fifth program state P5 according to the threshold voltage. The erasure state E of each of the flag cells indicates that corresponding main cells are not MSB-programmed, and the fifth program state P5 of each of the flag cells indicates that corresponding main cells have been MSB-programmed First to seventh verification read voltages Vvr1 to Vvr7 may be used for verifying states of the main cells in a verifying operation. For example, one of the first to seventh verification read voltages Vvr1 to Vvr7 may be selected and applied to a selected word line per program loop, according to the program and read algorithm. Furthermore, the fourth verification read voltages Vvr4 may be used for verifying states of the flag cells in the verifying operation. Description that is repetitive of FIG. 5 will not be provided.

Figure 7:
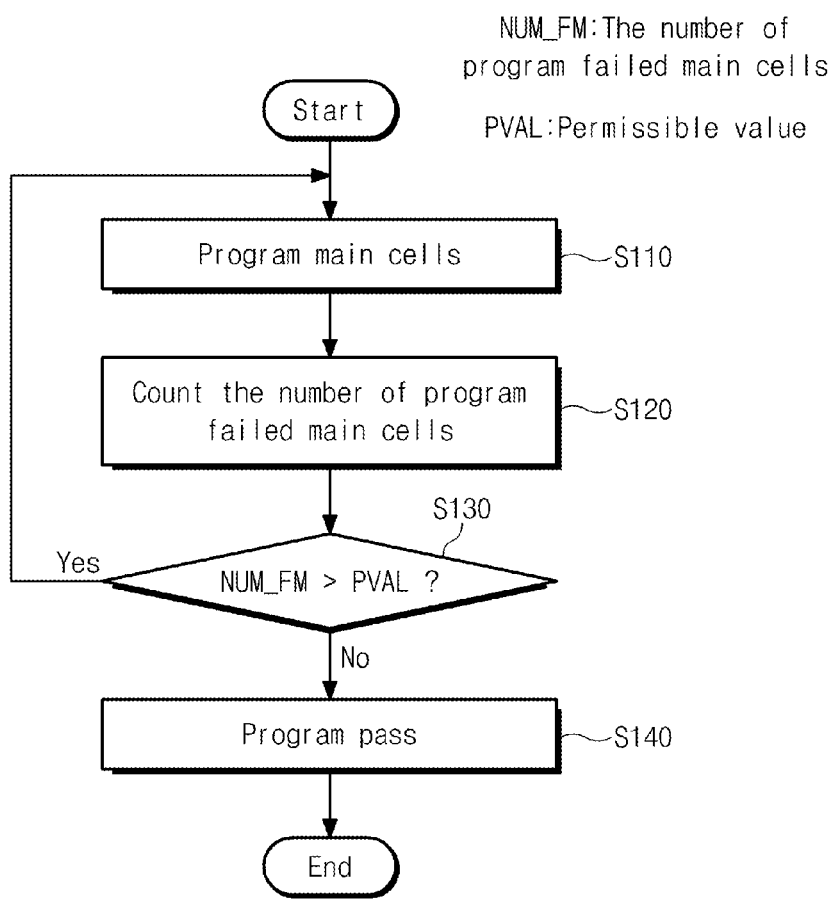
FIGS. 7 and 8 are flowcharts showing a programming method of a flash memory device, according to an embodiment of the inventive concept.
Figure 8:
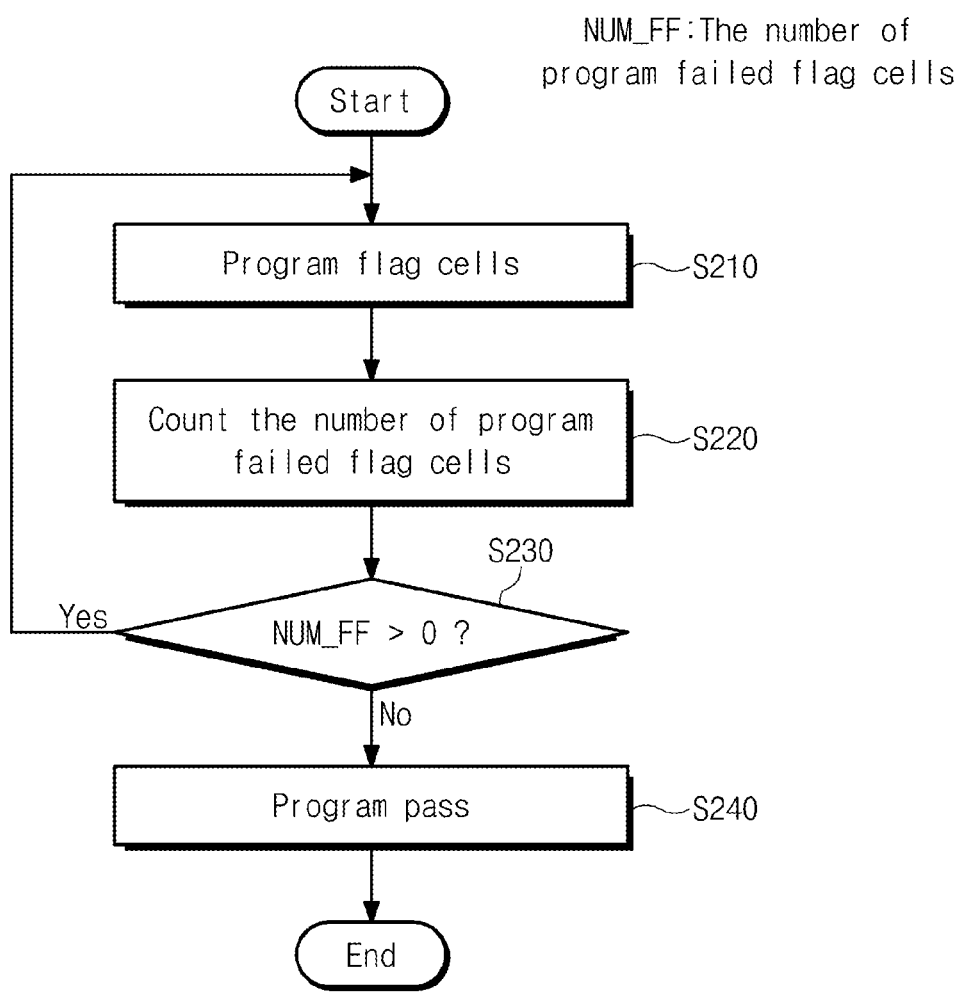

FIGS. 7 and 8 are flowcharts illustrating a programming method of a flash memory device, according to an embodiment of the inventive concept. FIG. 7 illustrates a flowchart of a programming method for main cells, and FIG. 8 illustrates a flowchart of a programming method for flag cells.

Referring to FIG. 7, main cells are programmed by page unit in operation S110. In operation S120, the number of failed bits (NUM_FM) of the main cells is counted. For example, a verification read voltage may be applied to a selected word line, and the number of main cells having a threshold voltage lower than the verification read voltage is counted.

In operation S130, it is judged whether the number of failed bits (NUM_FM) of the main cells exceeds a permissible value (PVAL) (e.g., the predetermined first permissible value). For example, the permissible value (PVAL) may be "1" or a number greater than "1." When the number of failed bits (NUM_FM) of the main cells exceeds the permissible value (PVAL), the main cells are judged to be program-failed and operations S110 and S120 are repeated. That is, a next program loop for the main cells is performed. When the number of failed bits (NUM_FM) of the main cells is equal to or less than the permissible value (PVAL) (and thus within the permissible range), the main cells of the page unit are judged to be program-passed in operation S140.

Referring to FIG. 8, flag cells are programmed by page unit in operation S210. In operation S220, the number of failed bits (NUM_FF) of the flag cells is counted. For example, a verification read voltage may be applied to a selected word line, and the number of flag cells having a threshold voltage lower than the verification read voltage is counted.

In operation S230, it is judged whether the number of failed bits (NUM_FF) of the flag cells exceeds "0" (e.g., the predetermined second permissible value), in the depicted embodiment. When the number of failed bits (NUM_FF) of the flag cells is greater than "0," the flag cells are judged to be program-failed and operations S210 and S220 are repeated. That is, a next program loop for the flag cells is performed. When the number of failed bits (NUM_FF) of the flag cells is equal to 0 (and thus within the second permissible range), the flag cells of the page unit are judged to be program-passed in operation S240. Accordingly, in determining program pass, the second permissible range for the number of failed bits of the flag cells is more strict than the first permissible range for the number of failed bits of the main cells.

The flash memory device according to the embodiments of the inventive concept may be incorporated within various products. For example, the flash memory device may be included in various electronic devices, such as digital cameras, camcorders, mobile phones, MP3 players, Portable Multimedia Player (PMPs), Play Station Portables (PSPs) and Personal Digital Assistants (PDAs), and storage devices such as Universal Serial Bus (USB) memories and Solid State Drives (SSDs).

Figure 9:
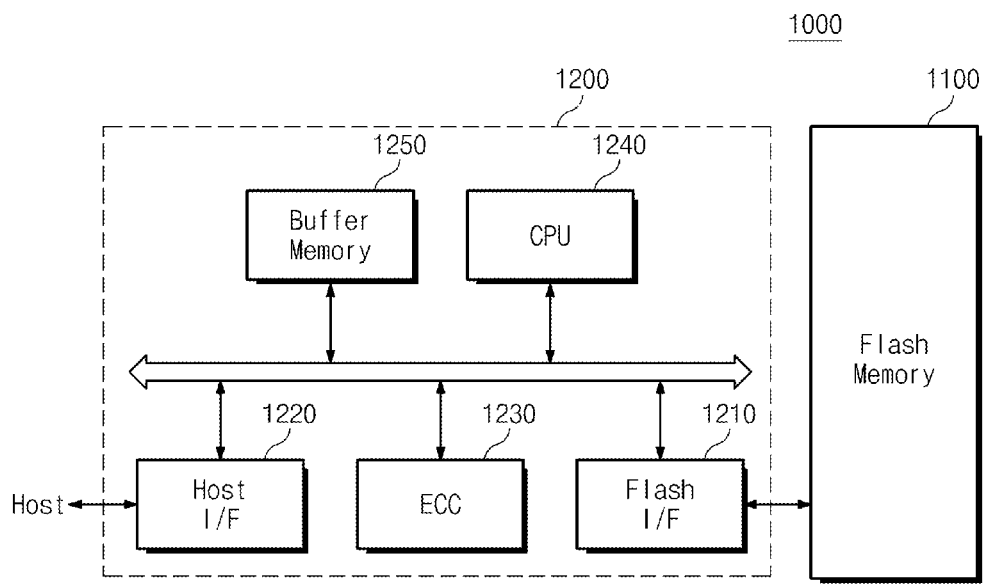
FIG. 9 is a block diagram showing a memory system using a flash memory device, according to an embodiment of the inventive concept.

FIG. 9 is a block diagram showing an illustrative memory system using a flash memory device, according to an embodiment of the inventive concept.

Referring to FIG. 9, a memory system 1000 according to an embodiment of the inventive concept includes a flash memory device 1100 and a memory controller 1200.

The flash memory device 1100 and the memory controller 1200 may be included in one storage device. The storage device may include mobile storage devices, such as USB memories and memory cards (MMC, SD cards, xD cards, CF cards, SIM cards, etc.). Also, the storage device may be connected to a host, such as a computer, a notebook computer, a digital camera, a portable phone, an MP3 player, a PMP and a game machine.

The flash memory device 1100 includes a memory cell array including main cells and flag cells. The flash memory device 1100 completes a programming operation when the number of failed bits of main cells is within a permissible range. Furthermore, the flash memory device 1100 may apply a more strict permissible range for the number of failed bits of flag cells than the permissible range for the number of failed bits of the main cells, and judge whether program pass is achieved.

The memory controller 1200 includes a flash interface 1210, a host interface 1220, an ECC circuit 1230, a central processing unit (CPU) 1240, and a buffer memory 1250.

The flash interface 1210 exchanges commands, addresses and data with the flash memory device 1100. For example, the flash interface 1210 provides a read command and address in a reading operation, and provides a write command, address and data in a writing operation. The host interface 1220 receives a request from the host, such as a request for a writing operation or a reading operation, or provides data in response to a request from the host.

The ECC circuit 1230 generates a parity bit (or ECC data) with data that is transmitted to the flash memory device 1110. The generated parity bit is stored in a spare area of the flash memory device 1100. The ECC circuit 1230 may detect an error in data read from the flash memory device 1100. When the detected error is in a correctable range, the ECC circuit 1230 corrects the detected error. The ECC circuit 1230 may be disposed inside/outside the memory controller 1200, according to the memory system 1000.

The CPU 1240 controls the reading and writing operations of the flash memory device 1100 in response to requests from the host. The buffer memory 1250 may temporarily store data read from the flash memory device 1100 or data provided from the host to be stored in the flash memory device 1100. Further, the buffer memory 1250 may be used to drive firmware, such as a Flash Translation Layer (FTL), which is managed and operated by the CPU 1240. The buffer memory 1250 may be implemented by a DRAM and an SRAM, for example.

The buffer memory 1250 may store table information necessary for managing read error information. For example, the table information may be metadata stored in a meta area of the flash memory device 1100 under control of the CPU 1240. The table information is copied from the meta area to the buffer memory 1250 at power-up. Although not shown, the memory system 1000 may further include a ROM that stores code data for interfacing with the host.

Figure 10:
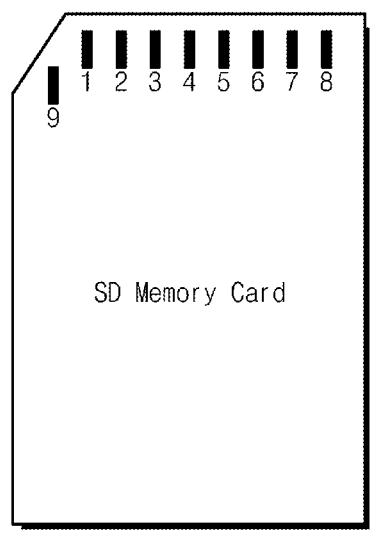
FIG. 10 is a block diagram showing a memory card including a flash memory device, according to an embodiment of the inventive concept.

FIG. 10 is a block diagram showing a memory card, which includes a flash memory device, according to an embodiment of the inventive concept. FIG. 10 illustrates an external shape of an SD memory card, for example, among memory cards.

Referring to FIG. 10, the SD memory card includes nine pins. The SD memory card includes four data pins (e.g., pins 1, 7, 8 and 9), one command pin (e.g., pin 2), one clock pin (e.g., pin 5), and three power pins (e.g., pins 3, 4 and 6). In the depicted configuration, command and response signals are transferred through the command pin (e.g., pin 2). Generally, the command signal is transmitted from a host to the memory card, and the response signal is transmitted from the memory card to the host.

The memory system 1000 according to an embodiment of the inventive concept may be implemented in a mobile storage device, such as an SD memory card. The memory system 1000 may include the flash memory device 1100, and the memory controller 1200 for controlling the flash memory device 1100.

The flash memory device 1100 includes a memory cell array including main cells and flag cells. The flash memory device 1100 completes a programming operation when the number of failed bits of the main cells is within a permissible range. The flash memory device 1100 may more apply a more strict permissible range for the number of failed bits of the flag cells than the permissible range for the number of failed bits of the main cells, and judge whether program pass is achieved.

Figure 11:
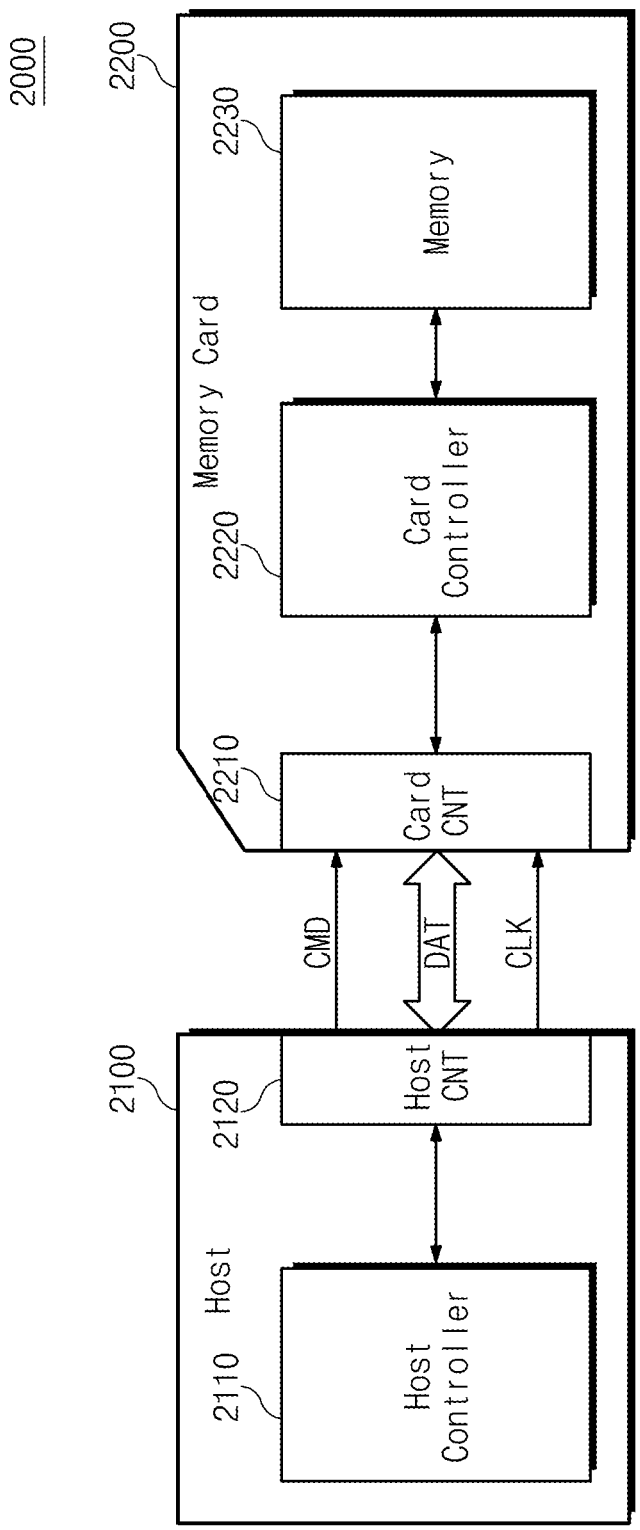
FIG. 11 is a block diagram showing an internal configuration of the memory card of FIG. 10 and a connection relationship with a host, according to an embodiment of the inventive concept.

FIG. 11 is a block diagram showing an internal configuration of the memory card of FIG. 10 and a connection relationship with a host.

Referring to FIG. 11, a memory card system 2000 includes a host 2100 and a memory card 2200. The host 2100 includes a host controller 2110 and a host interface unit 2120. The memory card 2200 includes a card interface unit 2210, a card controller 2220, and a memory 2230.

The host interface unit 2120 and the card interface unit 2210 include multiple pins. The pins include at least a command pin, a data pin, a clock pin, and a power pin. The number of pins varies with the type of memory card 2200. For example, an SD memory card includes nine pins, as discussed above with reference to FIG. 10.

The host 2100 writes data in the memory card 2200, or reads data stored in the memory card 2200. The host controller 2110 transmits a command (for example, a write command), a clock signal CLK generated by a clock generator (not shown) in the host 2100, and data DAT to the memory card 2200 through the host interface unit 2120.

The card controller 2220 stores the data DAT in the memory 2230 in synchronization with the clock signal CLK generated by the clock generator (not shown) in the card controller 2220, in response to the write command received through the card interface unit 2210. The memory 2230 stores data transmitted from the host 2100. For example, when the host 2100 is a digital camera, it stores video data.

The memory card system 2000 may be implemented by the memory system 1000, discussed above, according to an embodiment of the inventive concept. The memory system 1000 includes the flash memory device 1100 and the memory controller 1200. Likewise, the memory 2230 may be implemented by the flash memory device 1100, and the card controller 2220 may be implemented by the memory controller 1200.

The flash memory device 1100 includes a memory cell array including main cells and flag cells. The flash memory device 1100 completes a programming operation when the number of failed bits of the main cells is within a corresponding permissible range. The flash memory device 1100 may apply a more strict permissible range for the number of failed bits of the flag cells than the permissible range for the number of failed bits of the main cells, and judge whether program pass is achieved.

Figure 12:
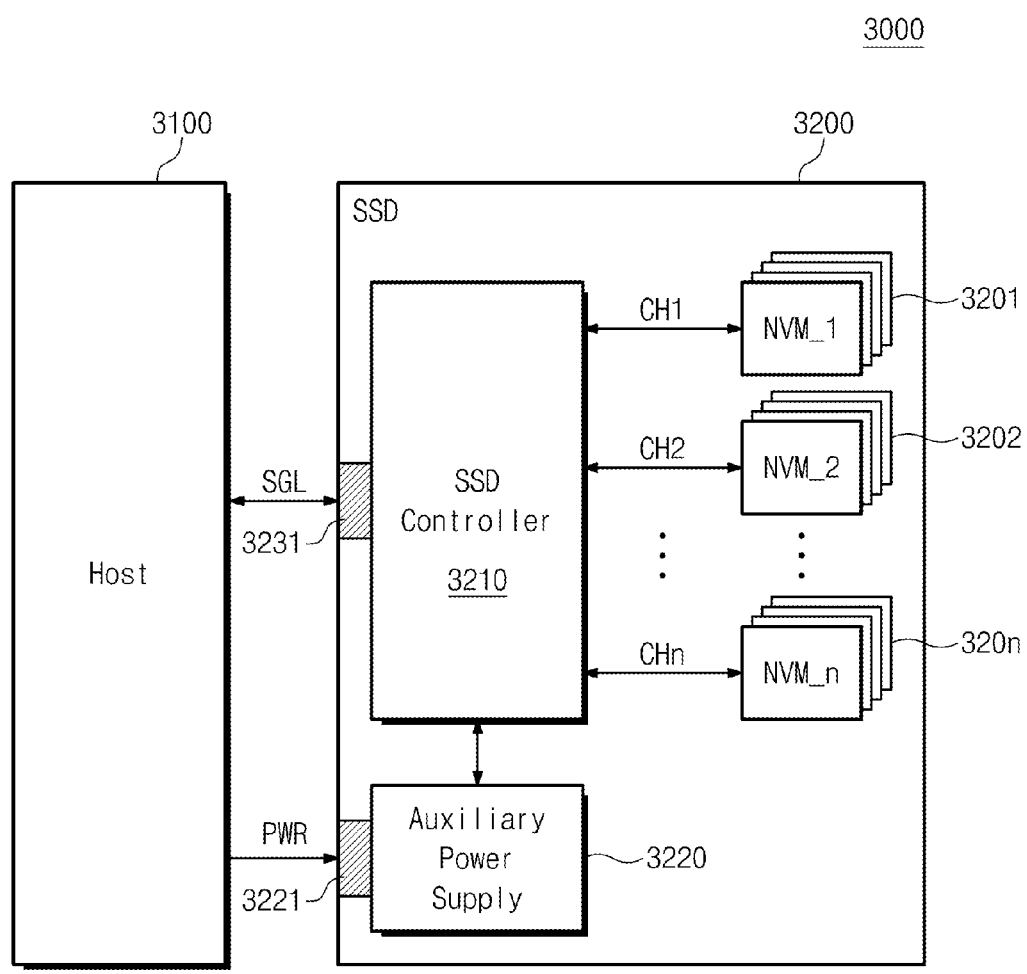
FIG. 12 is a block diagram showing an example in which a flash memory device, according to an embodiment of the inventive concept, is implemented as a solid state drive.

FIG. 12 is a block diagram showing an example in which a flash memory device, according to an embodiment of the inventive concept, is implemented as an SSD.

Referring to FIG. 12, an SSD system 3000 includes a host 3100 and an SSD 3200. The SSD 3200 exchanges signals with the host 3100 through a signal connector 3231, and receives power through a power connector 3221. The SSD 3200 includes multiple nonvolatile memory devices 3201 to 320n, an SSD controller 3210, and an auxiliary power supply 3220.

The nonvolatile memory devices 3201 to 320n are used as a storage medium of the SSD 3200. The nonvolatile memory devices 3201 to 320n may be implemented as flash memory devices having large-capacity storage ability. The SSD 3200 typically uses flash memory, but may use a volatile memory device, such as PRAM, MRAM, ReRAM and FRAM.

The nonvolatile memory devices 3201 to 320n may be connected to the SSD controller 3210 through channels CH1 to CHn. One or more memory devices may be connected to one channel. Memory devices connected to one channel may be connected to the same bus.

The SSD controller 3210 exchanges a signal SGL with the host 3100 through the signal connector 3231. The signal SGL may include a command, an address and data. The SSD controller 3210 writes data in a corresponding memory device or reads data from the corresponding memory device, according to a corresponding command from the host 3100. An illustrative internal configuration of the SSD controller 3210 will be described below with reference to FIG. 13.

The auxiliary power supply 3220 is connected to the host 3100 through the power connector 3221. The auxiliary power supply 3220 may be charged by power PWR applied from the host 3100. The auxiliary power supply 3220 may be disposed inside/outside the SSD 3200. For example, the auxiliary power supply 3220 may be disposed on a main board, and supply auxiliary power to the SSD 3200.

The SSD system 3000 may be implemented by memory system 1000, according to an embodiment of the inventive concept. The memory system 1000 may include the flash memory device 1100 and the memory controller 1200 for controlling the flash memory device 1100. Likewise, the nonvolatile memory devices 3201 to 320n may be implemented by the flash memory device 1100, and the SSD controller 3210 may be implemented by the memory controller 1200.

The flash memory device 1100 includes a memory cell array including main cells and flag cells. The flash memory device 1100 completes a programming operation when the number of failed bits of the main cells is within a permissible range. The flash memory device 1100 may apply a more strict permissible range for the number of failed bits of the flag cells than a permissible range for the number of failed bits of the main cells, and judge whether program pass is achieved.

Figure 13:
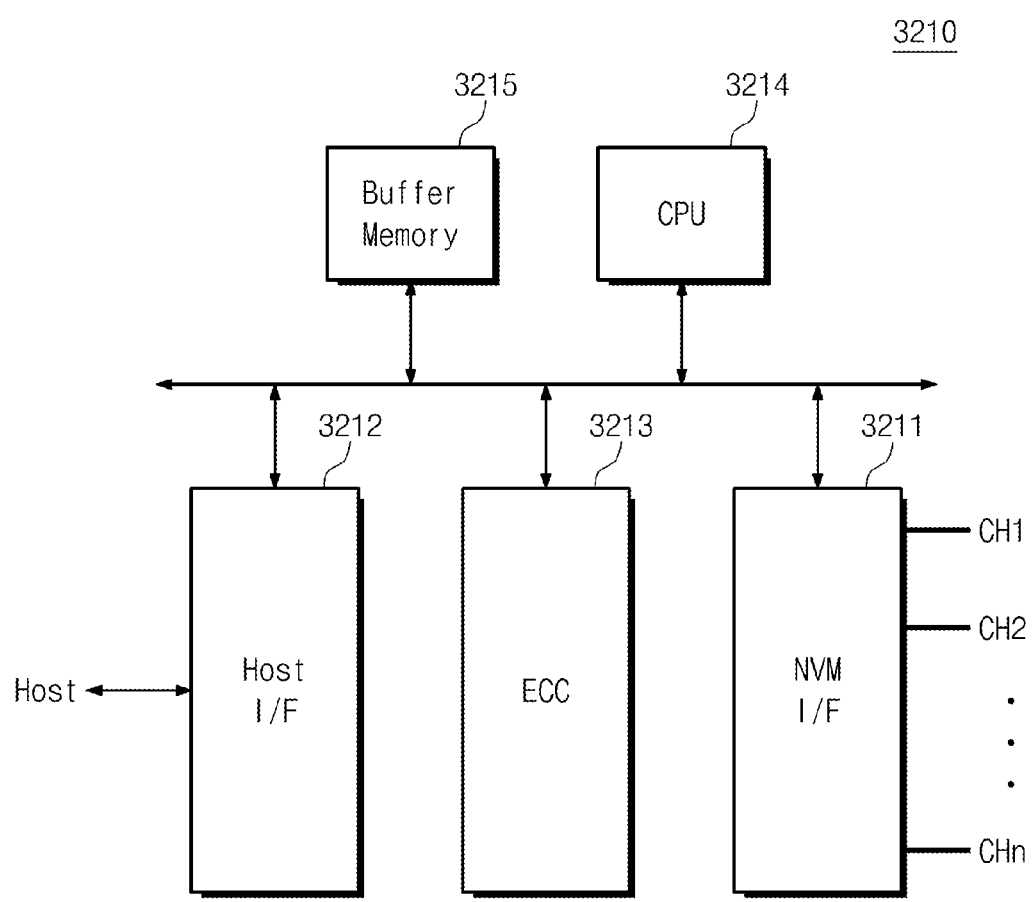
FIG. 13 is a block diagram showing an illustrative configuration of an SSD controller in FIG. 12, according to an embodiment of the inventive concept.

FIG. 13 is a block diagram showing an illustrative configuration of the SSD controller in FIG. 12, according to an embodiment of the inventive concept.

Referring to FIG. 13, the SSD controller 3210 includes an NVM interface 3211, a host interface 3212, an ECC circuit 3213, a CPU 3214, and a buffer memory 3215.

The NVM interface 3211 scatters data, which are transferred from the buffer memory 315, to channels CH1 to CHn, respectively. The NVM interface 3211 transfers data, which are read from the nonvolatile memory devices 3201 to 320n, to the buffer memory 3215. The NVM interface 3211 may use a NAND flash memory interface scheme, for example. That is, the SSD controller 3210 may perform a programming operation, a reading operation and an erasing operation according to the NAND flash memory interface scheme.

The host interface 3212 provides an interface with the SSD 3200 in response to a protocol of the host. The host interface 3212 may communicate with the host by using any of a variety of interface specifications, such as Universal Serial Bus (USB), Small Computer System Interface (SCSI), PCI Express (PIC-E), Advanced Technology Attachment (ATA), Parallel AT Attachment (PATA), Serial AT Attachment (SATA) or Serial Attached SCSI (SAS). Moreover, the host interface 3212 may perform a disk emulation function that provides aid for the host to recognize the SSD 3200 as a Hard Disk Drive (HDD).

The ECC circuit 3213 generates a parity bit with data that is transmitted to the nonvolatile memory devices 3201 to 320n. The parity bit is stored in spare areas of the nonvolatile memory devices 3201 to 320n. The ECC circuit 3213 detects errors of data that are read from the nonvolatile memory devices 3201 to 320n. When the detected error is in a correctable range, the ECC circuit 3213 corrects the detected error.

The CPU 3214 analyzes and processes the signal SGL input from the host. The CPU 3214 controls the host or the nonvolatile memory devices 3201 to 320n through the host interface 3212 or the NVM interface 3211. The CPU 3214 controls operations of the nonvolatile memory devices 3201 to 320n according to firmware for driving the SSD 3200.

The buffer memory 3215 temporarily stores write data provided from the host, or data that is read from a nonvolatile memory device. Also, the buffer memory 3215 may store metadata or cache data that will be stored in the nonvolatile memory devices 3201 to 320n. In a sudden power-off operation, the metadata or cache data stored in the buffer memory 3215 are stored in the nonvolatile memory devices 3201 to 320n. The buffer memory 3215 may include a DRAM or an SRAM, for example.

Figure 14:
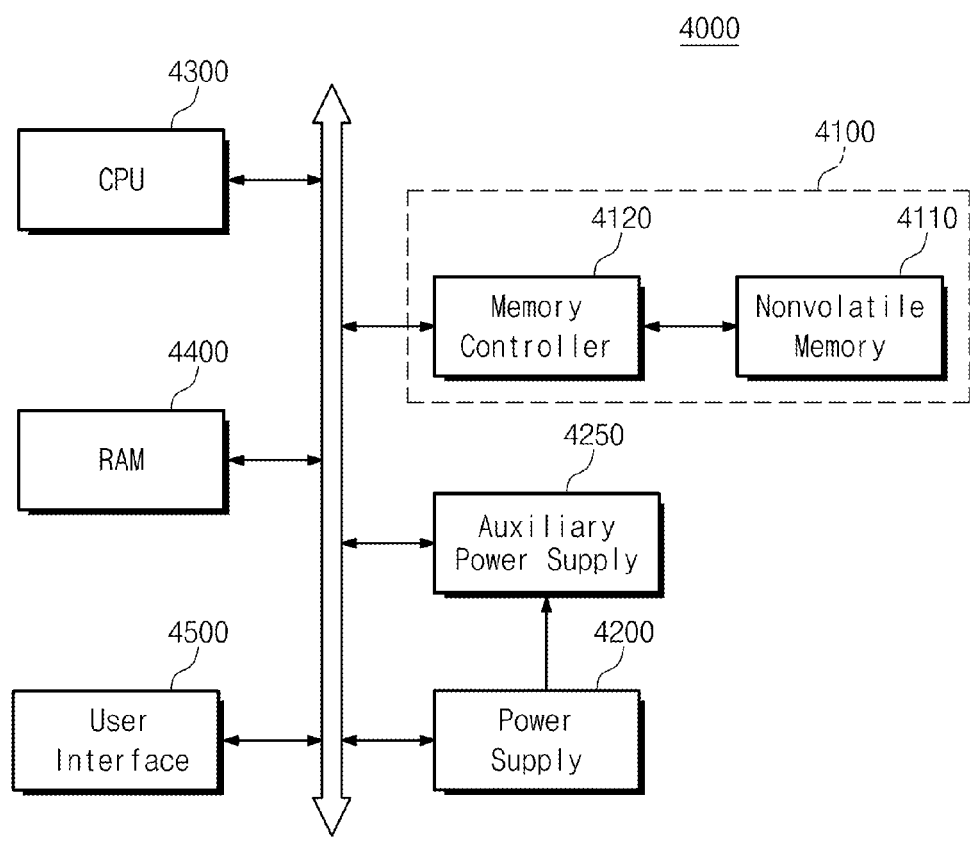
FIG. 14 is a block diagram showing an example in which a flash memory device, according to an embodiment of the inventive concept, is implemented in an electronic device.

FIG. 14 is a block diagram showing an example in which a flash memory device, according to an embodiment of the inventive concept, is implemented in an electronic device. An electronic device 4000 may be a personal computer, or may be a portable electronic device, such as a notebook computer, a mobile phone, a PDA or a camera, for example.

Referring to FIG. 14, the electronic device 4000 includes a power supply 4200, an auxiliary power supply 4250, a CPU 4300, a RAM 4400, and a user interface 4500. The memory system 4100 includes a flash memory 4110 and a memory controller 4120.

The memory system 4100 of the electronic device 4000 may be implemented by memory system 1000, according to an embodiment of the inventive concept. The memory system 1000 may include the flash memory device 1100, and the memory controller 1200 for controlling the flash memory device 1100. Likewise, the flash memory 4110 of the electronic device 4000 may be implemented by the flash memory device 1100, and the memory controller 4120 of the electronic device 4000 may be implemented by the memory controller 1200.

The flash memory device 1100 includes a memory cell array including main cells and flag cells. The flash memory device 1100 completes a programming operation when the number of failed bits of the main cells is within a permissible range. The flash memory device 1100 may apply a more strict permissible range for the number of failed bits of the flag cells than a permissible range for the number of failed bits of the main cells, and judge whether program pass is achieved.

The flash memory device and program operating method according to the various embodiments of the inventive concept apply moderate verification reference to memory cells and apply strict verification reference to flag cells, which store the programmed states of the memory cells, in the programming operation, and thus increase program operating speed and enhance reliability.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device comprising:
   a memory cell array comprising a plurality of main cells and a plurality of flag cells;
   a first judgment circuit for judging program pass of the main cells; and
   a second judgment circuit for judging program pass of the flag cells by applying a more strict judgment reference than the first judgment circuit.

2. The flash memory device of claim 1, wherein in a programming operation of the flag cells, the flag cells are judged as being program-failed when at least one flag cell of the plurality of flag cells is detected as having a threshold voltage lower than a verification read voltage.

3. The flash memory device of claim 1, wherein in a programming operation for the main cells, the first judgment circuit counts the number of failed bits of the main cells, and judges program pass of the main cells according to whether the counted number of failed bits is within a first permissible range.

4. The flash memory device of claim 3, wherein in a programming operation for the flag cells, the second judgment circuit counts the number of failed bits of the flag cells, and judges program pass of the flag cells according to whether the counted number of failed bits is within a second permissible range, which is more limited than the first permissible range of the first judgment circuit.

5. The flash memory device of claim 4, wherein the number of main cells and the number of flag cells are counted per program loop.

6. The flash memory device of claim 1, wherein the main cells and the flag cells are programmed by page unit, and wherein the flag cells are programmed while the main cells of a page corresponding to the flag cells are being programmed.

7. The flash memory device of claim 1, wherein each of the main cells and the flag cells comprises a multi-level cell storing 3-bit data.

8. The flash memory device of claim 1, wherein the flag cells are programmed to have one of at least two states for indicating whether the main cells are Most Significant Bit (MSB)-programmed.

9. The flash memory device of claim 1, further comprising:
   a control logic circuit for controlling a programming operation of the main cells in response to the judgment result of the first judgment circuit, and for controlling a programming operation of the flag cells in response to the judgment result of the second judgment circuit.

10. A flash memory device comprising:
    a memory cell array comprising a plurality of main cells, a plurality of first flag cells corresponding to 2-bit main cells of the plurality of main cells, and a plurality of second flag cells corresponding to 3-bit main cells of the plurality main cells;
    a first judgment circuit for judging program pass of the plurality of main cells, and outputting a main judgment signal indicating the judgment result;
    a second judgment circuit judging program pass of the first and second flag cells by applying a more strict judgment reference than the first judgment circuit, and outputting a flag judgment signal indicating the judgment result; and
    a control logic circuit for controlling a programming operation of the main cells in response to the main judgment signal, and controlling a programming operation of the first and second flag cells in response to the second judgment signal.

11. The flash memory device of claim 10, wherein in the programming operation for the main cells, even when at least one main cell has a threshold voltage lower than a verification read voltage, the first judgment circuit judges the main cells as being program-passed when the number of main cells having a threshold voltage lower than the verification read voltage is within a permissible range.

12. The flash memory device of claim 10, wherein in the programming operation for the first and second flag cells, the second judgment circuit judges the first and second flag cells as being program-passed when each of the first and second flag cells have a threshold voltage equal to or higher than a verification read voltage.

13. The flash memory device of claim 10, wherein the first flag cells are programmed to have one of at least two states for indicating whether the 2-bit main cells are Most Significant Bit (MSB)-programmed, and
    wherein the second flag cells are programmed to have one of at least two states for indicating whether the 3-bit main cells are MSB-programmed.

14. The flash memory device of claim 10, wherein a verification read voltage applied in the programming operation of the first flag cells differs from a verification read voltage applied in the programming operation of the second flag cells.

15. A method of programming a flash memory device including a memory cell array comprising a plurality of main cells and a plurality of flag cells, the method comprising:
    programming the plurality of main cells;
    programming the plurality of flag cells corresponding to the plurality of main cells;
    counting the number of failed bits of the main cells;
    counting the number of failed bits of the flag cells;
    judging the main cells to be program-failed when the counted number of failed bits of the main cells is greater than a predetermined first permissible value; and
    judging the flag cells to be program-failed when the counted number of failed bits of the flag cells is greater than a predetermined second permissible value, the predetermined second permissible value being more limited than the predetermined first permissible value.

16. The method of claim 15, wherein the predetermined first permissible value is one.

17. The method of claim 15, wherein the predetermined second permissible value is zero.

18. The method of claim 15, further comprising:
    repeating a program loop for the flag cells when the flag cells are judged to be program-failed.

19. The method of claim 15, wherein the predetermined first permissible value corresponds to a number of error bits which are corrected by an Error Correction Code (ECC) algorithm.

* * * * *